United States Patent [19]

Callahan

[11] 3,927,334

[45] Dec. 16, 1975

[54] MOSFET BISTRAP BUFFER

[75] Inventor: John Callahan, Mountain View, Calif.

[73] Assignee: Electronic Arrays, Inc., Mountain View, Calif.

[22] Filed: Apr. 11, 1974

[21] Appl. No.: 460,027

[52] U.S. Cl. ................ 307/269; 307/205; 307/214; 307/246; 307/293

[51] Int. Cl.²........................H03K 5/15; H03K 17/56; H03K 19/08; H03K 19/40

[58] Field of Search ........... 307/205, 214, 246, 251, 307/269, 270, 279, 293; 328/176

[56] References Cited

UNITED STATES PATENTS

| | | | |
|---|---|---|---|
| 3,641,370 | 2/1972 | Heimbigner | 307/205 X |
| 3,648,063 | 3/1972 | Hoffman et al. | 307/251 X |
| 3,735,277 | 5/1973 | Wanlass | 307/251 X |
| 3,764,823 | 10/1973 | Donofrio et al. | 307/205 |
| 3,769,528 | 10/1973 | Chu et al. | 307/270 |
| 3,778,784 | 12/1973 | Karp et al. | 307/279 X |
| R27,305 | 3/1972 | Polkinghorn et al. | 307/251 |

*Primary Examiner*—Michael J. Lynch
*Assistant Examiner*—L. N. Anagnos
*Attorney, Agent, or Firm*—Ralf H. Siegemund

[57] ABSTRACT

A bootstrap inverter is cascaded with a bootstrapping push-pull amplifier through a MOSFET, interconnecting particularly the output mode of the inverter with one input node of the push-pull amplifier, the output nodes of both amplifiers swing between ground and $V_g$, the input node of the push-pull stage swings between near ground and a voltage larger than $V_g$. The MOSFETs in the amplifiers have capacitive source-to-gate coupling for bootstrap action and conduction at below saturation current levels in the steady state. Two such buffer circuits can be combined to establish a two phase, buffered clock.

4 Claims, 2 Drawing Figures

MOSFET BISTRAP BUFFER

BACKGROUND OF THE INVENTION

The present invention relates to circuits of the variety which employ MOS-field effect transistors (or MOSFETs for short), and more particularly the invention relates to MOSFET buffer amplifiers driving relatively heavy (capacitive) load and are, therefor, subjected to the tendency of flattening signal rise and fall times.

MOSFET amplifiers are often constructed as push-pull arrangement in which the output circuit includes two serially connected MOSFETs, connected across ground and biasing voltage (a negative voltage in the case of P-channel, enhancement devices). The gate of one of the FETs is connected to receive the input signal directly, the gate of the other one is connected to receive the input signal through an inverter. The inverter may consist here to two serially interconnected MOSFETs, one being connected with its gate directly to drain potential of that FET to operate in saturation, the other one has its source connected to ground and receives also the input signal. The interconnected node of these devices can go at the most to $V_g - V_T$ where $V_T$ is the conduction threshold (and $V_g$ is negative for P-channel), and the push-pull output car go at the most to $V_g - 2V_T$.

An improvement of this circuit consists in modifying the push-pull output to obtain bootstrap operation. One obtains an output that may go the the full $V_g$ level, but the device is still rather slow. Moreover, when used in a two phase clock, the node established on the gate of the transistor which receives the inverted input is usually clamped to ground by the respective opposite clock phase; that requires a rather long swing on that node slowing signifcantly the rise time of the particular clock phase.

SUMMARY OF THE INVENTION

It is an object of the present invention to improve such MOSFET buffer amplifiers so that the rise and fall times of input signal are not or only insignificantly degraded with reference to the input signals.

It is another object of the present invention to provide for a new an improved MOSFET buffer which restores logic signal levels for rather heavy loads without degrading the duration of such signals.

It is a further object of the present invention to suggest a new and improved clock buffer for multiphase clocks.

In accordance with the preferred embodiment of the invention it is suggested to cascade two bootstrap amplifiers, one being an inverting amplifier the other one a push-pull amplifier, but each receiving the input signal, and a MOSFET device which is permanently gated for conduction couples the input node of the second amplifier to the output node of the first amplifier. This circuit configuration can be called a bistrap buffer. The input node of the first amplifier is connected to receive a gating signal continuously. The coupling device drains the input node of the second amplifier when the input changes so that the output node of the first amplifier is coupled to ground; the coupling device charges this input node of the second amplifier when the input changes and the output node of the first amplifier swings to supply voltage level and is held at that level while the input node has a voltage considerably below the supply voltage level. Neither of the amplifiers operates at saturation so that the non-conductive state can be achieved without extensive swing times in either case.

It was found that even in the case of a heavy capacitive load on the output, rise and fall times of the output signals are hardly degraded as compared with rise and fall times of the input signal. Moreover, the buffer is capable of restoring the effective signal level in that the full supply voltage level is available on the output even if the input signal only to half that value. In other words, the output of the buffer provides either $V_g$ or near ground, dependent upon the input, while the input may swing over a much smaller range.

The invention finds particular utility as buffer for a clock, particularly for generating a two phase clock signal out of an input clock. Two such cascaded amplifier buffers are used here, one each for producing a different phase. The clock is applied via a bootstrap inverter as an input signal to one buffer and via still another boot-strap inverter to the other buffer. Additionally, the output of each buffer serves as clamp for the respective other buffer and here particularly as controlled by-pass to ground for the output node of the respective first stage in each buffer.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Proceeding now to the detailed description of the drawings, FIG. 1 illustrates two cascaded bootstrap amplifiers 10 and 20, interconnected by a FET 30, and connected for operation between a source of voltage potential $V_g$ and ground, constituting a second source of voltage potential.

Figure 1:
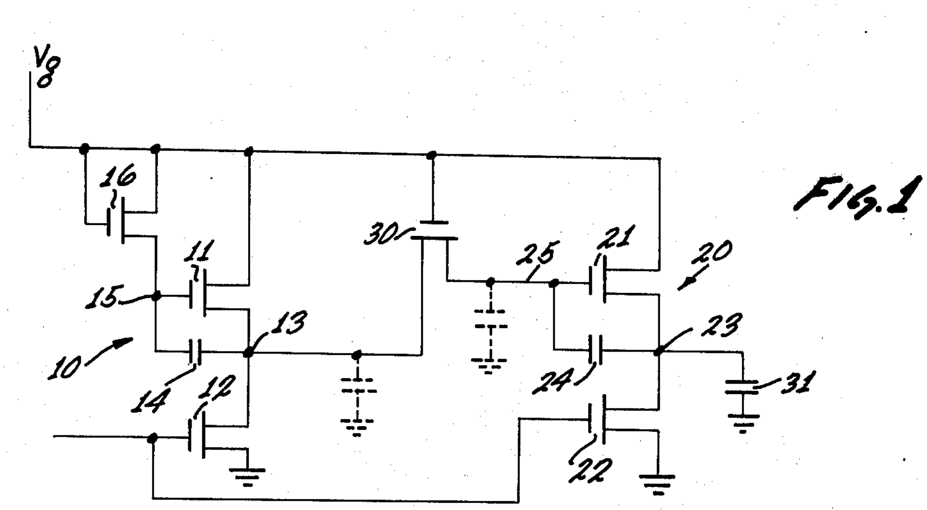
FIG. 1 is a circuit diagram of a bistrap buffer amplifier system in accordance with the preferred embodiment of the invention.

The first stage amplifier 10 is a bootstrap inverter and is particularly comprised of two serially interconnected FETs 11 and 12, with an interconnect point 13 constituting the output node of amplifier 10. A capacitor 14 connects the source electrode of FET 11 (i.e. interconnect point - node 13) to the gate of FET 11 to establish bootstrap action. The gate establishes a second node 15 of this amplifier which is charged through a FET 16 having its gate and source electrodes connected directly to $V_g$.

The gate of FET 12 receives an input signal rendering device 12 either conductive or non-conductive. When not conductive, $V_g$ is effective on node 13. Transistor 11, however, does not conduct because the drain-to-source voltage. Upon turning FET 12 on for conduction, ground or near ground potential is applied to output node 13 of the first stage. Transistor 12 is a low impedance device (short and wide) as compared with transistor 11 which is long and narrow, so that near ground prevails on node 13.

Second stage amplifier 20 is somewhat analogously constructed but is connected to operate as a non-inverting push-pull device. Amplifier 20 has two serially interconnected FETs 21 and 22, whose gates receive oppositely phased inputs. The gate of FET 22 is connected to receive the same input signal as applied to the gate of FET 12; the gate of transistor 21 establishes also a node 25, which receives the second input from this push-pull device. The interconnect point 23 of FETs 21 and 22 is capacitively -capacitor 24- connected to the gate of FET 21 for bootstrap action. Node 23 is the output node of the second stage of the buffer. A capacitor 31 represents the, usually, capacitive load on the buffer. This capacitor has the tendency to slur signals and to flatten flanks. The FET 30 cascading the two stages has its two main electrodes connected between nodes 13 and 25, and then applies the inverted input proper (inverted by stage 10) to the gate of FET 21. The gate electrode of FET 30 connects to $V_g$ so that the transistor channel is always biased for conduction as far as the gate is concerned.

The steady state of the device, for an input signal at FETs 12 and 22 rendering them conductive is as follows. Nodes 13 and 23 are coupled to ground. Devices 11/12 have an impedance ratio so that node 13 is indeed near ground potential. Transistor 11 conducts but at saturation current levels. Whatever charge was previously held on node 25 had been drained off through transistor 30 until the node potential dropped to a valve insufficient to sustain further current flow. Transistor 21 is, therefor, conductive at a rather high impedance only so that node 23 is at or very close to ground potential.

It should be realized, that even if the input signal as applied to the gates of FETs 12 and 22 is only as small as ½ $V_g$ or even smaller, the voltage at node 23 is closer to ground than one threshold level about ground. By way of example, the input signal may be as low as −10 volts, with $V_g$ being −24 volts. The voltage at node 13 may be as small as minus one quarter of a volt, and the voltage at node 23 is even smaller than that, because even if devices 11 and 12 are similarly dimensioned, the effective impedance for FET 21 is higher than for FET 11 because node 25 has a lesser charge than node 15.

Assuming now that the input at the gates of FETs 12 and 22 goes to ground (or to about the conduction threshold valve) these transistors are rendered non-conductive. Accordingly, node 13 begins to charge and capacitor 14 establishes the charge level of node 13 to the full value of $V_g$. Upon being charged node 13 becomes the drain for conductive FET 30 which in turn charges node 25. As node 25 is being charged transistor 21 charges node 23 which in turn causes the gate potential for FET 21, node 25, to turn on the FET 21 by bootstrap action, i.e. in a regenerative fashion.

Node 25 continues to charge, and by bootstrap action its potential goes beyond $V_g$ so that node 25 becomes the drain of FET 30. During this period of charging node 23, current flow through device 21 is well in the saturation range, so that the node charges rapidly even if constituted by a large capacitor 31. Conduction through FET 30 ceases when its gate-to-source potential has dropped to less than its threshold as soon as node 13 has reached the $V_g - V_T$ level. As soon as the voltage on node 23 approaches $U_T$, FET 21 conducts in the non-saturated state. After node 23 has in fact been pulled up to $V_g$, it stays at that level $V_g$ by operation of the bootstrap capacitor 24 while the device 21 conducts at a non saturation current level.

By way of example, if the input signal rises only to about −2 volts, the potential at node 13 drops clear to −24 volts, while node 25 goes well below −30 volts, while node 23 is also at near −24 volts. This data demonstrates that stage 10 operates as an inverter and stage 20 operates as push-pull, cascaded with stage 10, but does not provide additional inversion. The output of stage 20 is, therefore, the inversion of the input signal.

If the input at the gates of FETs 12 and 22 goes to a "one" again (−10 volts), node 13 is discharged. Since device 12 conducts at non-saturation level part of the time, the discharge of node 13 is rather rapid indeed. Node 13 now becomes the source of device 30. The gate to source voltage of FET 30 rises quickly above the threshold of FET 30 so that the charge on node 25 is drained off, while node 23 is drained through conductive transistor 22. Accordingly, FET 21 is turned off, again with re-enforcement through bootstrap action by capacitor 24. The node 23 (capacitor 31) discharges through device 22, and even if the charge is substantial, non-saturation of transistor 21 and capacitive coupling (24) to separately discharge node 25 ensures rapid discharge of node 23, and the signal edge thus produced is quite steep.

It can readily be seen, that the inverting buffer assembly restores logic signal levels. The input signal may swing only between −2 and −10 volts or even less, while the output swings from a fraction of one volt (negative) down to the full −24 volts supply level.

Figure 2:
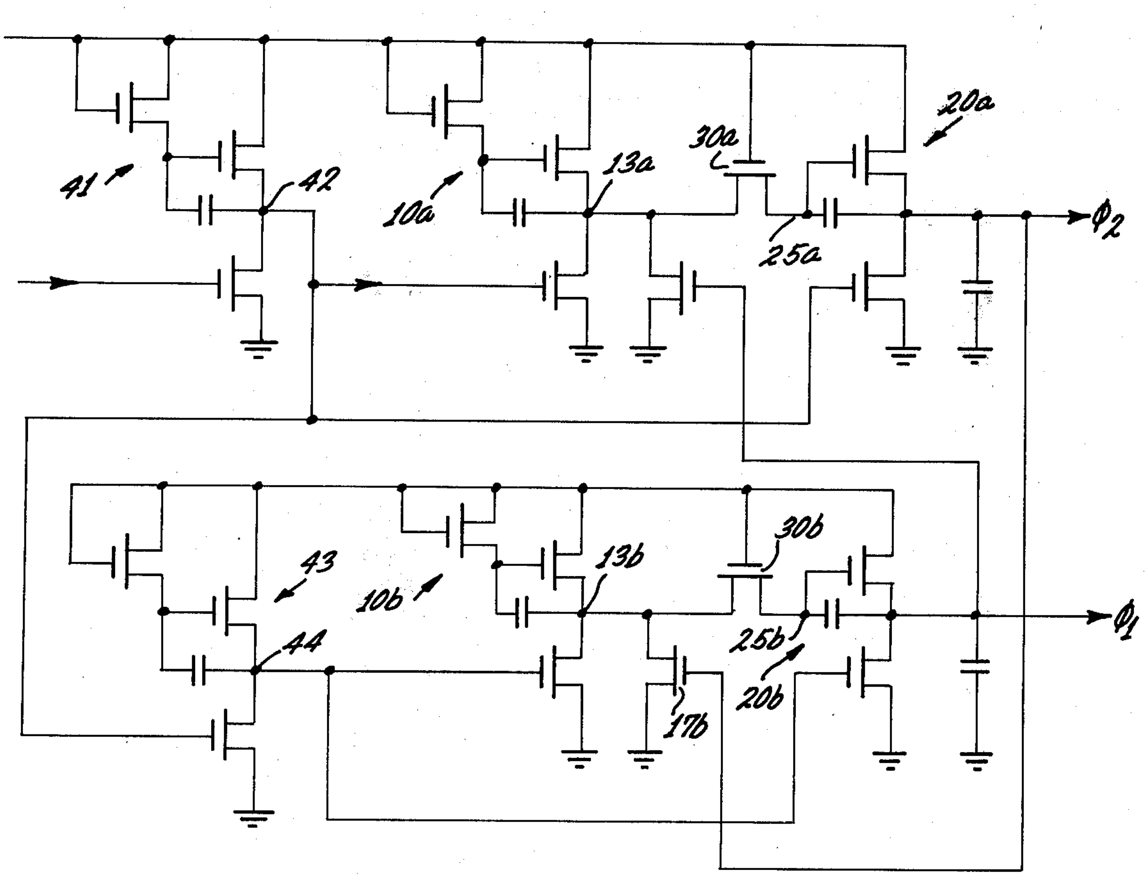
FIG. 2 is a circuit diagram of a two phase clock, using two bistrap buffers as shown in FIG. 1.

FIG. 2 illustrates a two phase clock operating in response to an input clock signal applied to terminal 40. The circuit has a first bootstrap inverter 41 with an output terminal 42 connected to various parts in the circuit. First of all, the signal from terminal 42 serves as input signal for a first bistrap device having an inverter 10*a* cascaded with a push-pull amplifier, corresponding to circuits 10 and 20 in FIG. 1 and interconnected presently by a FET 30*a*. The circuit 10*a*, 20*a* and 30*a* establish a first cascaded bistrap buffer wherein the output of circuit 20*a* is the clock phase $\phi_2$. (The designation is arbitrary, but $\phi_2$ is in-phase with the clock input due to inversion in 41).

The output signal from terminal 42 is additionally fed to another bootstrap inverter 43 whose output terminal 44 provides the input to the bootstrap circuits 10*b* and 20*b*, also corresponding to circuits 10 and 20 in FIG. 1 and being coupled by a FET 30*b* to obtain the second cascaded buffer wherein the output of push-pull 20*a* is the clock phase $\phi_1$.

The two bootstrap inverters 41, 43 together restore the signal level for the input of the $\phi_1$ - clock buffer, 10*b* - 20*b* - 30*b*, and inverter 41 establishes the same level for $\phi_2$, so that even for rather low voltage swings in the input the full level of $V_g$ is already available as input for each buffer. This feature is beneficial for steepening rise and fall times.

In order to obtain mutual locking, signal $\phi_1$ is provided additionally as gating signal to a FET 17*a*, to hold the node 13*a* to ground as long as $\phi_1$ is "one", so as to prevent $\phi_2$ to assume the one state until $\phi_1$ has dropped to zero. In other words, node 13*a* cannot be charged as long as the clock $\phi_1$ is high. Analogously, the clock $\phi_2$ is applied to a FET 17*b* to hold the node 13*b* to ground as long as $\phi_2$ is one so as to prevent $\phi_1$ to assume the one state until $\phi_2$ has dropped to zero.

The utilization of the two bootstrap inverters 41 and 43 ensures a fast transition from $\phi_1$ to $\phi_2$ and vice versa. Particularly the clamps at MOSFETs 17*a* and 17*b* are removed at a high rate so that the production of the respective opposite clock phase is not impeded. It is particularly important here that the two clamps (17*a*, 17*b*) are not directly applied to the nodes of the respective output circuits (i.e., 25*a* and 25*b*), rather, they are applied to the outputs of the first stages in such instance.

The invention is not limited to the embodiments described above but all changes and modifications thereof not constituting departures from the spirit and scope of the invention are intended to be included.

I claim:

1. A MOSFET buffer system, comprising:

a first bootstrap inverter and a first bootstrap push-pull amplifier each having an output and two inputs, one input of each of said first bootstrap inverter and said first bootstrap push pull amplifier being connected for receiving an input signal, the respective other input of the first inverter connected for receiving a permanent bias;

a first, permanently gated-on MOSFET interconnecting the other input of the first push-pull amplifier and the output of the first inverter;

a second bootstrap inverter and a second bootstrap push-pull amplifier, each having an output and two inputs, one input of each of said second bootstrap inverter and said second strap push pull amplifier being connected for receiving an input signal, the respective other input of the second inverter connected for receiving a permanent bias;

a second permanently gated-on MOSFET interconnected to the other input of the second push-pull amplifier and the output of the second inverter;

means for providing the input signal to the one input in each of said first inverter and first push pull amplifier; and a third inverter, receiving the input signal as applied to the first inverter and inverting it and connected to apply the inverted input signal as an input signal to the second inverter and the second push pull amplifier.

2. A buffer system as in claim 1, the third inverter being also a bootstrap inverter.

3. A buffer system as in claim 1, said means being another bootstrap inverter.

4. A buffer system as in claim 8, two clamping MOSFETs respectively connected for preventing either push-pull output from having the same level as the respective other one, the clamping MOSFET for the output of the first inverter connected for gate control by the ouput of the second push-pull amplifier, the clamping MOSFET for the output of the second inverter connected for gate control by the output of the first push-pull amplifier.

* * * * *